United States Patent
Hussell et al.

(10) Patent No.: US 9,496,466 B2
(45) Date of Patent: Nov. 15, 2016

(54) LIGHT EMITTER DEVICES AND METHODS, UTILIZING LIGHT EMITTING DIODES (LEDS), FOR IMPROVED LIGHT EXTRACTION

(75) Inventors: Christopher P. Hussell, Cary, NC (US); Justin Lydon, Durham, NC (US); Raymond Rosado, Apex, NC (US); Jeffrey C. Britt, Cary, NC (US)

(73) Assignee: Cree, Inc., Durham, NC (US)

( * ) Notice: Subject to any disclaimer, the term of this patent is extended or adjusted under 35 U.S.C. 154(b) by 123 days.

(21) Appl. No.: 13/312,508

(22) Filed: Dec. 6, 2011

(65) Prior Publication Data

US 2013/0141905 A1    Jun. 6, 2013

(51) Int. Cl.
*H01L 33/54* (2010.01)
*H01L 23/00* (2006.01)
*H01L 33/20* (2010.01)

(52) U.S. Cl.
CPC .............. *H01L 33/54* (2013.01); *H01L 24/49* (2013.01); *H01L 33/20* (2013.01); *H01L 2224/49113* (2013.01); *H01L 2924/00014* (2013.01); *H01L 2924/01322* (2013.01); *H01L 2924/12041* (2013.01); *H01L 2933/005* (2013.01); *H01L 2933/0058* (2013.01); *Y10T 29/4913* (2015.01); *Y10T 29/49117* (2015.01); *Y10T 29/49169* (2015.01)

(58) Field of Classification Search
CPC ..................... H01L 33/52; H01L 33/54; H01L 33/56; H01L 33/501; H01L 33/483
USPC .......................................... 362/311.01–311.1
See application file for complete search history.

(56) References Cited

U.S. PATENT DOCUMENTS

| | | |
|---|---|---|
| 3,288,728 A | 11/1966 | Gorham |
| 3,609,475 A | 9/1971 | Kaposhilin |
| 3,875,456 A | 4/1975 | Kano et al. |
| H445 H | 3/1988 | Bock et al. |
| 4,918,497 A | 4/1990 | Edmond |
| 4,946,547 A | 8/1990 | Palmour |
| 4,966,862 A | 10/1990 | Edmond |
| 5,027,168 A | 6/1991 | Edmond |
| 5,200,022 A | 4/1993 | Kong |
| 5,210,051 A | 5/1993 | Carter, Jr. |
| 5,338,944 A | 8/1994 | Edmond |

(Continued)

FOREIGN PATENT DOCUMENTS

| | | |
|---|---|---|
| CN | 101276870 A | 10/2008 |
| CN | 101438424 A | 5/2009 |

(Continued)

OTHER PUBLICATIONS

Restriction Requirement for U.S. Appl. No. 13/372,076 dated Jan. 31, 2013.

(Continued)

*Primary Examiner* — Robert May
(74) *Attorney, Agent, or Firm* — Jenkins, Wilson, Taylor & Hunt, P.A.

(57) ABSTRACT

Light emitter devices with improved light extraction and related methods are disclosed. In one embodiment, the light emitter device can include a submount, at least one light emitting chip disposed over the submount, and a lens disposed over the light emitting chip. The lens can include a lens base that can have substantially the same geometry as a geometry of the submount.

68 Claims, 6 Drawing Sheets

(56) References Cited

U.S. PATENT DOCUMENTS

| | | | |
|---|---|---|---|
| 5,359,345 A | 10/1994 | Hunter | |
| RE34,861 E | 2/1995 | Davis | |
| 5,393,993 A | 2/1995 | Edmond | |
| 5,416,342 A | 5/1995 | Edmond | |
| 5,523,589 A | 6/1996 | Edmond | |
| 5,604,135 A | 2/1997 | Edmond | |
| 5,631,190 A | 5/1997 | Negley | |
| 5,739,554 A | 4/1998 | Edmond | |
| 5,912,477 A | 6/1999 | Negley | |
| 5,959,316 A | 9/1999 | Lowery | |
| 6,120,600 A | 9/2000 | Edmond | |
| 6,121,637 A | 9/2000 | Isokawa et al. | |
| 6,187,606 B1 | 2/2001 | Edmond | |
| 6,201,262 B1 | 3/2001 | Edmond | |
| 6,252,254 B1 | 6/2001 | Soules et al. | |
| 6,350,041 B1 | 2/2002 | Tarsa et al. | |
| 6,576,930 B2 | 6/2003 | Reeh et al. | |
| 6,600,175 B1 | 7/2003 | Baretz | |
| 6,717,353 B1* | 4/2004 | Mueller et al. | 313/501 |
| 6,791,119 B2 | 9/2004 | Slater, Jr. | |
| 6,853,010 B2 | 2/2005 | Slater, Jr. | |
| 6,860,621 B2* | 3/2005 | Bachl et al. | 362/373 |
| 6,936,857 B2 | 8/2005 | Doxsee et al. | |
| 6,958,497 B2 | 10/2005 | Emerson | |
| 7,005,679 B2 | 2/2006 | Tarsa et al. | |
| 7,026,661 B2 | 4/2006 | Murano | |
| 7,087,936 B2 | 8/2006 | Negley | |
| 7,095,056 B2 | 8/2006 | Vitta | |
| 7,183,577 B2 | 2/2007 | Mueller-Mach | |
| 7,211,835 B2 | 5/2007 | Ono | |
| 7,213,940 B1 | 5/2007 | Van De Ven | |
| 7,244,965 B2 | 7/2007 | Andrews et al. | |
| 7,246,930 B2 | 7/2007 | Yatsuda et al. | |
| 7,250,715 B2 | 7/2007 | Mueller et al. | |
| 7,304,326 B2 | 12/2007 | Suehiro et al. | |
| 7,344,902 B2 | 3/2008 | Basin et al. | |
| 7,456,499 B2 | 11/2008 | Loh | |
| 7,476,909 B2 | 1/2009 | Nagai et al. | |
| 7,534,635 B1 | 5/2009 | Foust et al. | |
| 7,564,180 B2 | 7/2009 | Brandes | |
| 7,598,669 B2 | 10/2009 | Toguchi et al. | |
| 7,638,811 B2 | 12/2009 | Slater | |
| 7,655,957 B2 | 2/2010 | Loh | |
| 7,709,853 B2 | 5/2010 | Medendorp | |
| 7,791,061 B2 | 9/2010 | Edmond et al. | |
| 7,821,023 B2 | 10/2010 | Yuan et al. | |
| 7,825,575 B2 | 11/2010 | Sawanobori et al. | |
| 7,833,073 B2 | 11/2010 | Ogawa | |
| 7,842,526 B2 | 11/2010 | Hadame et al. | |
| 7,868,343 B2 | 1/2011 | Negley | |
| 7,952,115 B2 | 5/2011 | Loh | |
| 8,011,818 B2 | 9/2011 | Negley | |
| 8,052,307 B2* | 11/2011 | Bak et al. | 362/257 |
| 8,058,088 B2 | 11/2011 | Cannon | |
| 8,398,892 B2 | 3/2013 | Shioi | |
| 8,858,022 B2 | 10/2014 | Jiang et al. | |
| 8,946,747 B2 | 2/2015 | Reiherzer | |
| 8,957,580 B2 | 2/2015 | Reiherzer | |
| 9,240,530 B2 | 1/2016 | Reiherzer | |
| 9,343,441 B2 | 5/2016 | Reiherzer | |
| 2002/0004577 A1 | 1/2002 | Biebuyck et al. | |
| 2003/0067761 A1 | 4/2003 | Horiuchi et al. | |
| 2004/0069993 A1 | 4/2004 | Murano | |
| 2004/0079957 A1 | 4/2004 | Andrews et al. | |
| 2004/0252501 A1 | 12/2004 | Moriyama | |
| 2005/0007783 A1 | 1/2005 | Ono | |
| 2005/0045898 A1 | 3/2005 | Leu et al. | |
| 2005/0093430 A1* | 5/2005 | Ibbetson et al. | 313/501 |
| 2005/0159581 A1 | 7/2005 | Vanderzande et al. | |
| 2005/0224830 A1 | 10/2005 | Blonder et al. | |
| 2006/0091415 A1 | 5/2006 | Yan | |
| 2006/0113906 A1 | 6/2006 | Ogawa | |
| 2006/0124953 A1 | 6/2006 | Negley et al. | |
| 2006/0138621 A1 | 6/2006 | Bogner | |
| 2006/0145172 A1 | 7/2006 | Su et al. | |
| 2006/0163589 A1 | 7/2006 | Fan et al. | |
| 2006/0181866 A1 | 8/2006 | Jung et al. | |
| 2006/0186418 A1 | 8/2006 | Edmond | |
| 2006/0221272 A1 | 10/2006 | Negley | |
| 2006/0226759 A1 | 10/2006 | Masuda et al. | |
| 2007/0012940 A1 | 1/2007 | Suh et al. | |
| 2007/0090383 A1 | 4/2007 | Ota et al. | |
| 2007/0139923 A1 | 6/2007 | Negley | |
| 2007/0158668 A1 | 7/2007 | Tarsa | |
| 2007/0170447 A1 | 7/2007 | Negley | |
| 2007/0223219 A1 | 9/2007 | Medendorp et al. | |
| 2007/0228387 A1* | 10/2007 | Negley et al. | 257/79 |
| 2007/0253209 A1 | 11/2007 | Loh | |
| 2007/0268694 A1 | 11/2007 | Bailey et al. | |
| 2008/0012036 A1 | 1/2008 | Loh | |
| 2008/0080165 A1 | 4/2008 | Kim et al. | |
| 2008/0081065 A1 | 4/2008 | Bulavin | |
| 2008/0121921 A1 | 5/2008 | Loh | |
| 2008/0173884 A1 | 7/2008 | Chitnis | |
| 2008/0179611 A1 | 7/2008 | Chitnis | |
| 2008/0198112 A1 | 8/2008 | Roberts | |
| 2008/0237616 A1* | 10/2008 | Hatakoshi et al. | 257/94 |
| 2008/0239724 A1 | 10/2008 | Moriyama et al. | |
| 2008/0258130 A1 | 10/2008 | Bergmann | |
| 2008/0303052 A1 | 12/2008 | Lee et al. | |
| 2008/0308825 A1 | 12/2008 | Chakraborty | |
| 2009/0039375 A1 | 2/2009 | LeToquin | |
| 2009/0050907 A1 | 2/2009 | Yuan | |
| 2009/0050908 A1 | 2/2009 | Yuan | |
| 2009/0050924 A1 | 2/2009 | Edmond | |
| 2009/0065792 A1 | 3/2009 | Thompson et al. | |
| 2009/0080185 A1 | 3/2009 | McMillan | |
| 2009/0108281 A1 | 4/2009 | Keller et al. | |
| 2009/0179213 A1 | 7/2009 | Cannon | |
| 2009/0184616 A1 | 7/2009 | Van De Ven | |
| 2009/0194782 A1 | 8/2009 | Hata et al. | |
| 2009/0212316 A1 | 8/2009 | Braune et al. | |
| 2009/0231833 A1 | 9/2009 | Miki et al. | |
| 2009/0236621 A1 | 9/2009 | Chakraborty | |
| 2009/0236759 A1 | 9/2009 | Kashiwagi | |
| 2009/0250714 A1 | 10/2009 | Yun et al. | |
| 2009/0261374 A1 | 10/2009 | Hayashi | |
| 2009/0283779 A1 | 11/2009 | Negley et al. | |
| 2009/0295265 A1 | 12/2009 | Tabuchi et al. | |
| 2009/0309116 A1 | 12/2009 | Kato et al. | |
| 2009/0315057 A1 | 12/2009 | Konishi et al. | |
| 2010/0025699 A1* | 2/2010 | Liu | H01L 25/0753 257/89 |
| 2010/0025709 A1 | 2/2010 | Koseki et al. | |
| 2010/0102344 A1 | 4/2010 | Ueji | |
| 2010/0103660 A1 | 4/2010 | Van de Ven et al. | |
| 2010/0133556 A1 | 6/2010 | Li et al. | |
| 2010/0155763 A1 | 6/2010 | Donofrio | |
| 2010/0200874 A1 | 8/2010 | Shioi et al. | |
| 2010/0203657 A1 | 8/2010 | Kim | |
| 2010/0208487 A1 | 8/2010 | Li | |
| 2010/0213502 A1 | 8/2010 | Kashiwagi et al. | |
| 2010/0226130 A1 | 9/2010 | Cheng et al. | |
| 2010/0237375 A1 | 9/2010 | Yamazaki et al. | |
| 2010/0252851 A1 | 10/2010 | Emerson et al. | |
| 2010/0258830 A1 | 10/2010 | Ide et al. | |
| 2010/0283381 A1 | 11/2010 | Takahashi et al. | |
| 2010/0289395 A1 | 11/2010 | Sun et al. | |
| 2011/0001148 A1 | 1/2011 | Sun et al. | |
| 2011/0031513 A1 | 2/2011 | Hsieh et al. | |
| 2011/0046319 A1 | 2/2011 | Ueno et al. | |
| 2011/0204398 A1 | 8/2011 | Tanida et al. | |
| 2011/0220920 A1 | 9/2011 | Collins | |
| 2011/0220929 A1 | 9/2011 | Collins et al. | |
| 2011/0220939 A1 | 9/2011 | Nakayama | |
| 2011/0242806 A1 | 10/2011 | Ramer et al. | |
| 2011/0248289 A1 | 10/2011 | Hsieh et al. | |
| 2011/0253429 A1 | 10/2011 | Humphries et al. | |
| 2011/0272721 A1 | 11/2011 | Butterworth | |
| 2012/0126257 A1 | 5/2012 | Reiherzer et al. | |
| 2012/0161621 A1 | 6/2012 | Sato | |
| 2012/0193649 A1 | 8/2012 | Donofrio | |
| 2012/0193660 A1 | 8/2012 | Donofrio | |
| 2013/0020590 A1 | 1/2013 | Lin | |

(56) References Cited

U.S. PATENT DOCUMENTS

| | | |
|---|---|---|
| 2013/0141920 A1 | 6/2013 | Emerson |
| 2013/0161650 A1 | 6/2013 | Lai |
| 2013/0168719 A1 | 7/2013 | Watkins et al. |
| 2013/0207130 A1 | 8/2013 | Reiherzer |
| 2013/0207141 A1 | 8/2013 | Reiherzer |
| 2013/0207142 A1 | 8/2013 | Reiherzer |
| 2013/0208442 A1 | 8/2013 | Reiherzer |
| 2013/0214298 A1 | 8/2013 | Lin |

FOREIGN PATENT DOCUMENTS

| | | |
|---|---|---|
| CN | 101 814 571 A | 8/2010 |
| CN | 102214776 A | 10/2011 |
| EP | 1536487 | 6/2005 |
| EP | 2056363 A2 | 5/2009 |
| EP | 2365549 A1 | 9/2011 |
| EP | 2786429 | 10/2014 |
| EP | 2791982 | 10/2014 |
| EP | 2791984 | 10/2014 |
| JP | S58 67077 A | 4/1983 |
| JP | 2001-291406 | 10/2001 |
| JP | 2003-243704 A | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010-092956 A | 4/2010 |
| JP | 2010-103404 | 5/2010 |
| JP | 2010-206015 A | 9/2010 |
| JP | 2010-226093 A | 10/2010 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A2 | 9/2004 |
| WO | WO 2009-107052 | 9/2009 |
| WO | WO 2010-113852 | 10/2010 |
| WO | WO 2011-109097 | 9/2011 |
| WO | WO 2013-013154 | 1/2013 |
| WO | WO 2013-082445 | 6/2013 |
| WO | WO 2013-085793 | 6/2013 |
| WO | WO 2013-085816 | 6/2013 |
| WO | WO 2013/101385 | 7/2013 |

OTHER PUBLICATIONS

Non-Final Office Action for U.S. Appl. No. 13/372,076 dated Aug. 8, 2013.
Restriction Requirement for U.S. Appl. No. 13/309,177 dated Sep. 16, 2013.
U.S. Appl. No. 13/372,063 dated Feb. 13, 2012.
U.S. Appl. No. 13/444,394 dated Apr. 11, 2012.
U.S. Appl. No. 13/444,399 dated Apr. 11, 2012.
U.S. Appl. No. 13/372,076 dated Feb. 13, 2012.
U.S. Appl. No. 13/309,117 dated Dec. 1, 2011.
U.S. Appl. No. 13/554,769 dated Jul. 20, 2012.
U.S. Appl. No. 13/312,518 dated Dec. 6, 2011.
U.S. Appl. No. 12/757,891 dated Apr. 9, 2010.
Ming Ma, et al., Effects of the refractive index of the encapsulant on the light-extraction efficiency of light-emitting diodes, Optics Express, Sep. 12, 2011, pp. A1135-A1140, vol. 19, No. S5.
"SCS Parylene Coatings for LEDs," Specialty Coating Systems, 2009, pp. 1-2, Indianapolis, IN, USA.
"SCS Electronic Coatings," Specialty Coating Systems, 2010, pp. 1-4, Indianapolis, IN, USA.
International Search Report and Written Opinion for Application No. PCT/US2012/047608 dated Jan. 31, 2013.
International Search Report and Written Opinion for Application No. PCT/US2012/067323 dated Mar. 15, 2013.
International Search Report and Written Opinion for Application No. PCT/US2012/067326 dated Mar. 15, 2013.
International Search Report and Written Opinion for Application No. PCT/US2012/067055 dated Mar. 28, 2013.
International Search Report and Written Opinion for Application No. PCT/US2012/067058 dated Mar. 29, 2013.
Restriction Requirement for U.S. Appl. No. 13/554,769 dated Oct. 9, 2013.
Non-Final Office Action for U.S. Appl. No. 13/309,177 dated Feb. 13, 2014.
Non-Final Office Action for U.S. Appl. No. 13/312,518 dated Feb. 28, 2014.
Non-Final Office Action for U.S. Appl. No. 13/554,769 dated Mar. 18, 2014.
Restriction Requirement for U.S. Appl. No. 13/372,063 dated Apr. 10, 2014.
Restriction Requirement for U.S. Appl. No. 13/691,102 dated Apr. 11, 2014.
Non-Final Office Action for U.S. Appl. No. 13/372,076 dated Mar. 18, 2014.
Non-Final Office Action for U.S. Appl. No. 13/444,394 dated Jul. 22, 2014.
Non-Final Office Action for U.S. Appl. No. 13/372,063 dated Jul. 28, 2014.
Non-Final Office Action for U.S. Appl. No. 13/309,177 dated Sep. 11, 2014.
Restriction Requirement for U.S. Appl. No. 13/691,102 dated Oct. 3, 2014.
Final Office Action for U.S. Appl. No. 13/554,769 dated Oct. 16, 2014.
Non-Final Office Action for U.S. Appl. No. 13/312,518 dated Jul. 17, 2014.
Final Office Action for U.S. Appl. No. 13/312,518 dated Nov. 24, 2014.
Non-Final Office Action for U.S. Appl. No. 13/444,399 dated Nov. 14, 2014.
Japanese Office Action for Application No. 2014/521828 dated Jan. 6, 2015.
Final Office Action for U.S. Appl. No. 13/444,394 dated Jan. 23, 2015.
Taiwanese Office Action for Application No. 101126247 dated Dec. 19, 2014.
Non-Final Office Action for U.S. Appl. No. 13/312,518 dated Mar. 13, 2015.
Narukawa et al. "White light emitting diodes with super-high luminous efficacy", Journal of Physics D, 43 (2010) 354002.
Advisory Action for U.S. Appl. No. 13/554,769 dated Jan. 5, 2015.
First Chinese Office Action for Application No. 2012 800 440 227 dated Jan. 15, 2016.
Advisory Action for U.S. Appl. No. 13/309,177 dated Feb. 12, 2016.
Chinese Office Action for Application No. 2012 800604373 dated Feb. 15, 2016.
Final Office Action for U.S. Appl. No. 13/691,102 dated Feb. 25, 2016.
Advisory Action for U.S. Appl. No. 13/554,769 dated Mar. 24, 2016.
Chinese Office Action for Application No. 2012 800 690 449 dated Apr. 6, 2016.
Advisory Action for U.S. Appl. No. 13/691,102 dated May 20, 2016.
Final Office Action for U.S. Appl. No. 13/312,518 dated Jun. 1, 2016.
Non-Final Office Action for U.S. Appl. No. 13/554,769 dated Jun. 10, 2016.

(56) References Cited

OTHER PUBLICATIONS

Non-Final Office Action for U.S. Appl. No. 13/309,177 dated Jun. 9, 2016.
Notice of Allowance for U.S. Appl. No. 13/372,076 dated Oct. 7, 2014.
Notice of Allowance for U.S. Appl. No. 13/372,063 dated Oct. 8, 2014.
Notice of Allowance for U.S. Appl. No. 13/372,063 dated Jan. 22, 2015.
Notice of Allowance for U.S. Appl. No. 13/444,394 dated Sep. 11, 2015.
Final Office Action for U.S. Appl. No. 13/309,177 dated Nov. 16, 2015.
Non-Final Office Action for U.S. Appl. No. 13/312,518 dated Dec. 3, 2015.
Final Office Action for U.S. Appl. No. 13/554,769 dated Dec. 4, 2015.
Notice of Allowance for U.S. Appl. No. 13/444,399 dated Jan. 15, 2016.
"Press Release Nichia Corporation" posted to http://www.nichia.com/en/about_nichia/2010/2010_110201.html on Nov. 2, 2010, captured by Wayback Machine on Dec. 1, 2011, accessed on Nov. 7, 2014.
Korean Office Action for Application No. 10-2014-7004030 dated Feb. 9, 2015.
Non-Final Office Action for U.S. Appl. No. 13/309,177 dated Apr. 23, 2015.
Non-Final Office Action for U.S. Appl. No. 13/691,102 dated Apr. 24, 2015.
Non-Final Office Action for U.S. Appl. No. 13/554,769 dated Apr. 27, 2015.
Final Office Action for U.S. Appl. No. 13/444,399 dated Apr. 28, 2015.
Japanese Office Action for Application No. 2014-545949 dated May 19, 2015.
Notice of Allowance for U.S. Appl. No. 13/444,394 dated Jun. 5, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.
Extended European Search Report for Application No. EP 12863904 dated Jun. 22, 2015.
Extended European Search Report for Application No. EP 12853831 dated Jun. 22, 2015.
Notice of Allowance for U.S. Appl. No. 13/444,394 dated Jun. 29, 2015.
Final Office Action for U.S. Appl. No. 13/312,518 dated Aug. 4, 2015.
Non-Final Office Action for U.S. Appl. No. 13/444,394 dated Aug. 27, 2015.

\* cited by examiner

LIGHT EMITTER DEVICES AND METHODS, UTILIZING LIGHT EMITTING DIODES (LEDS), FOR IMPROVED LIGHT EXTRACTION

TECHNICAL FIELD

The subject matter disclosed herein relates generally to light emitting diode (LED) devices and methods. More particularly, the subject matter disclosed herein relates to light emitter devices and methods for improved light extraction.

BACKGROUND

Light emitting diodes (LEDs) can be utilized in light emitter devices or packages for providing different color points of light, for example, blue, red, and green light, combinations of light having different color points, and white light (e.g., perceived as being white or near-white). Light emitter devices or packages are developing as replacements for incandescent, fluorescent, and metal halide high-intensity discharge (HID) light products. Conventional light emitter devices may utilize optical elements such as lenses for improving the amount of light extracted from such devices. One problem with conventional lenses is that the corners of the device submount are not fully improved for light extraction, as conventional lenses fail to extend near or proximate the edges of the submount. Currently, designers and manufacturers of light emitter devices and lighting products are trending towards using and adapting products to which use emitter devices that are dimensionally smaller. Accordingly, improving light extraction from the corners of the light emitter device submount is becoming more important for maintaining or exceeding expected optical properties, such as brightness levels, expected and required from a given device.

Despite the availability of various light emitter devices in the marketplace, a need remains for devices and methods having improved efficiency and light extraction. Such improvements can be easily scalable to accommodate the demand for dimensionally smaller devices.

SUMMARY

In accordance with this disclosure, light emitter devices and methods are provided. Such devices and methods can have improved light extraction and be well suited for a variety of applications including personal, industrial, and commercial lighting products. It is, therefore, an object of the present disclosure herein to provide light emitter devices and methods which improve light extraction, in one aspect, by extracting light from areas at the corners of the device substrate or submount.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
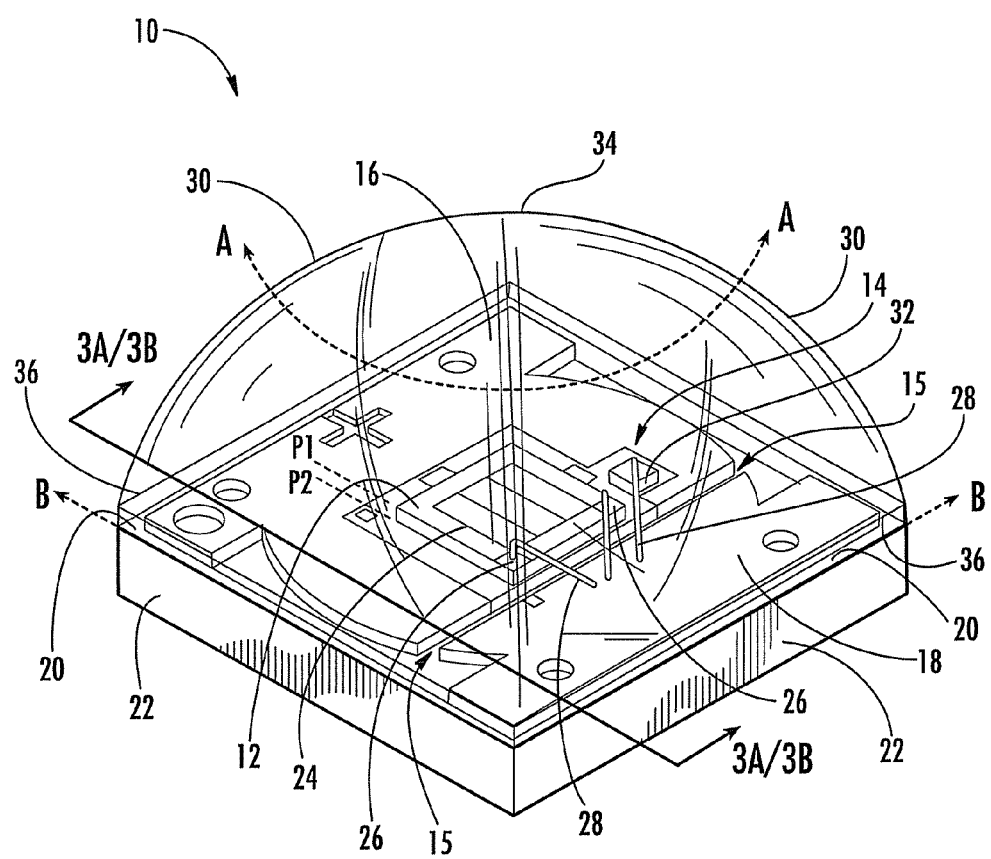
FIG. 1 is a top perspective view of an embodiment of a light emitter device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitter devices according to embodiments described herein can comprise group III-V nitride (e.g., gallium nitride (GaN)) based light emitting diodes (LEDs) or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs according to some embodiments of the present subject matter, for example, can be fabricated on growth substrates (e.g., Si, SiC, or sapphire substrates) to provide horizontal devices (with at least two electrical contacts on a same side of the LED) or vertical devices (with electrical contacts on opposing sides of the LED). Moreover, the growth substrate can be maintained on the LED after fabrication or removed (e.g., by etching, grinding, polishing, etc.). The growth substrate can be removed, for example, to reduce a thickness of the resulting LED and/or to reduce a forward voltage through a vertical LED. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

One or more LEDs can be at least partially coated with one or more phosphors. The phosphors can absorb a portion of the LED light and emit a different wavelength of light such that the light emitter device or package emits a combination of light from each of the LED chip and the phosphor. In one embodiment, the light emitter device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter devices and methods according to the present subject matter can also have multiple LEDs of different colors, one or more of which can be white emitting.

Figure 3A:
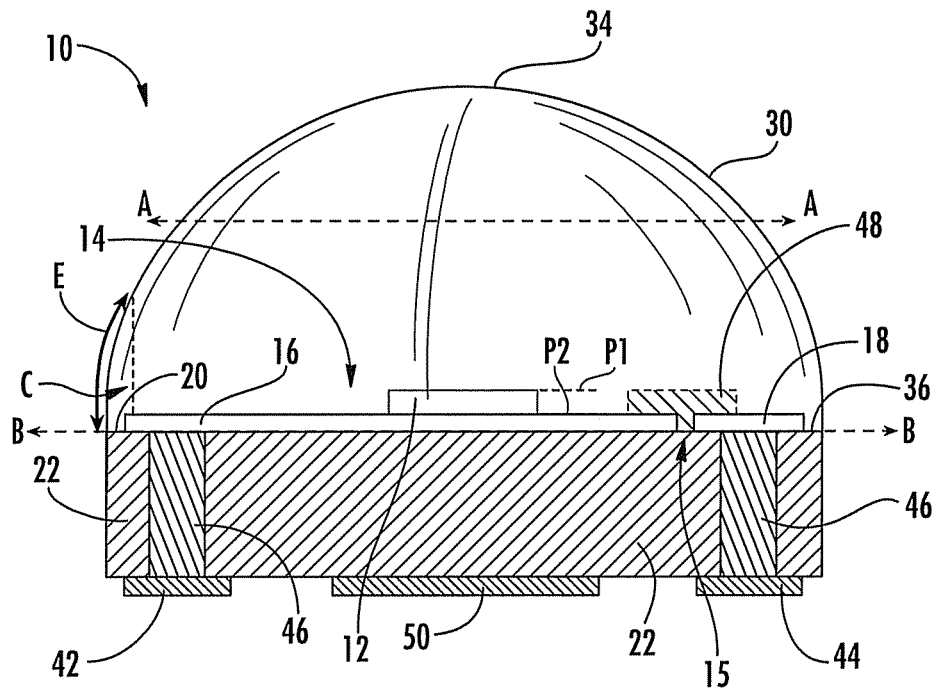
FIGS. 3A and 3B are cross-sectional views of light emitter devices according to the disclosure herein.
Figure 3B:
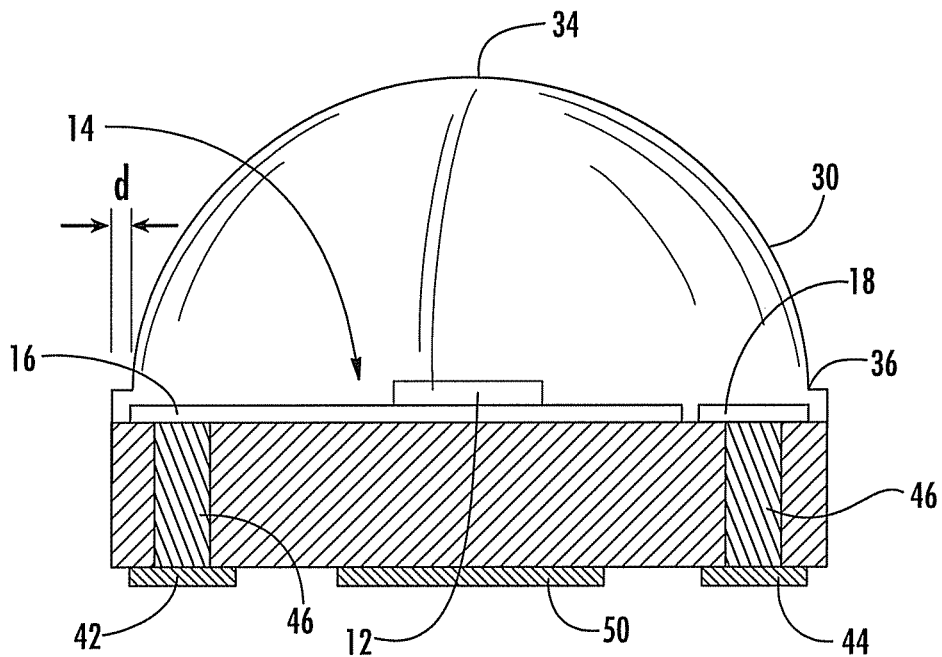
Figure 4:
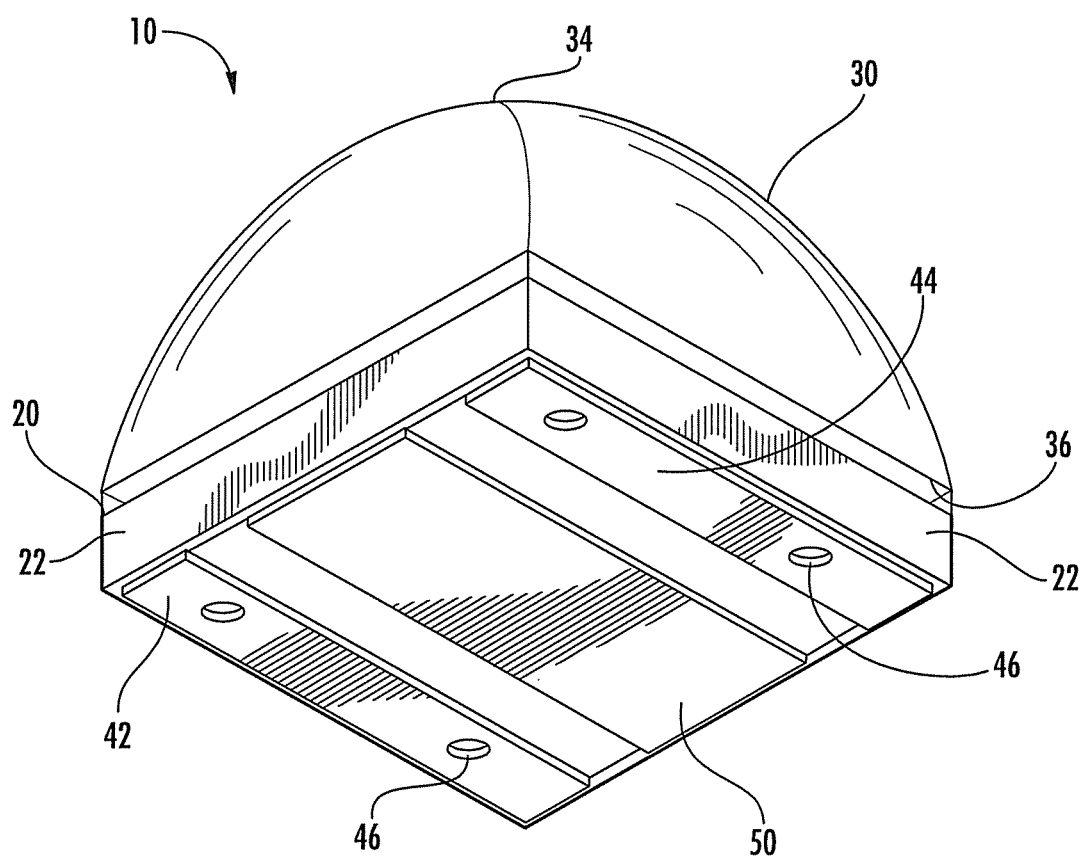
FIG. 4 is a bottom perspective view of a light emitter device according to the disclosure herein.
Figure 5:
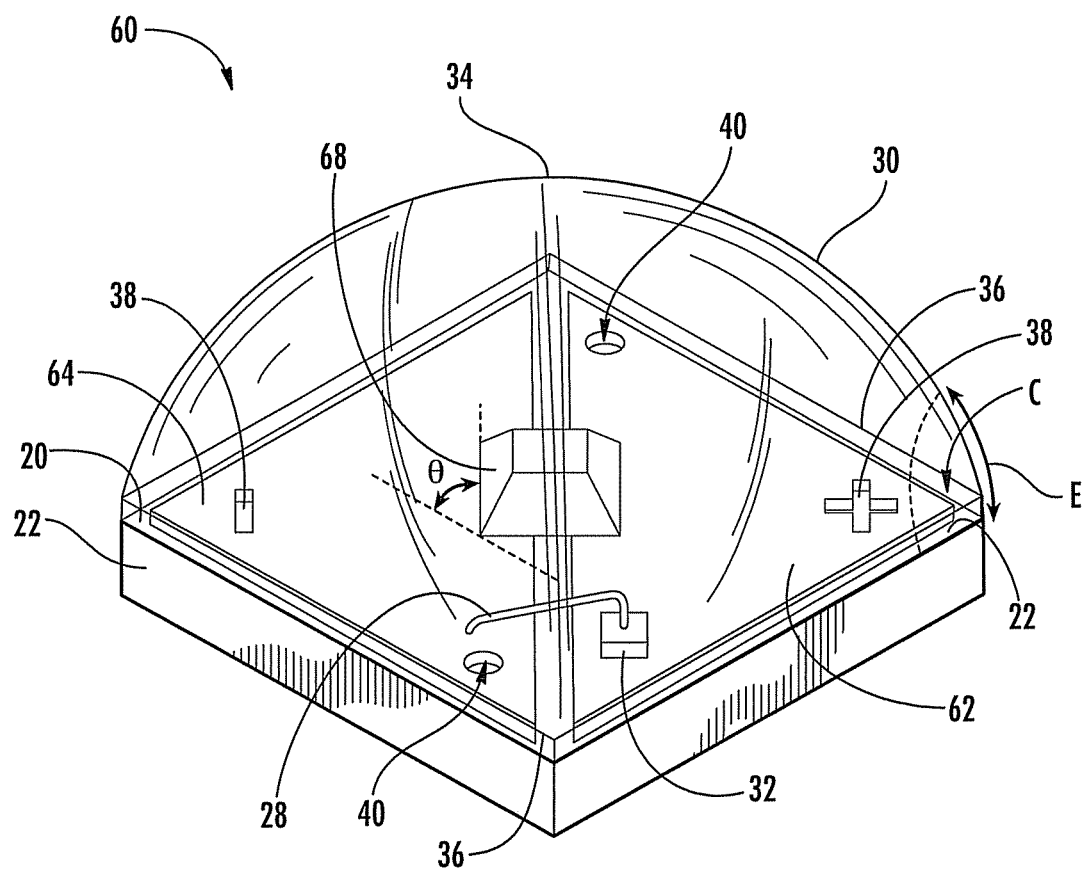
FIG. 5 is a top perspective view of another embodiment of a light emitter device according to the disclosure herein.

Referring now to FIGS. 1 to 6, embodiments of light emitter devices and methods are disclosed. FIGS. 1 to 4 illustrate a first embodiment of a light emitter package or device generally designated 10 according to the present subject matter. FIG. 5 illustrates a second embodiment of a light emitter package or device, generally designated 60 which can be similar in form and function to device 10 with a couple of differences, for example, one difference being that the LED chip is directly attached in FIG. 5 (e.g., not wire bonded) and another difference being that the LED chip is aligned differently with respect to the submount in FIG. 5 (e.g., the LED chip in FIG. 5 can be rotated with respect to the submount surface). Light emitter device 10 can comprise at least one solid state emitter such as an LED chip 12 arranged over a mounting pad, generally designated 14. Mounting pad 14 can comprise any suitable electrically conductive material known in the art, for example, metals or metal alloys, copper (Cu), aluminum (Al), tin (Sn), silver (Ag), conductive polymer material(s), and/or combinations thereof. Mounting pad 14 can be formed integral with or electrically and/or thermally isolated from electrical components of light emitter device 10. For example, electrical components can comprise first and second electrical elements 16 and 18, respectively. First and second electrical elements 16 and 18 can comprise any suitable electrically conducting material known in the art, for example, metals or metal alloys, Cu, Al, Sn, Ag, conductive polymer material(s), and/or combinations thereof.

In one aspect, mounting pad 14 and first and second electrical elements 16 and 18 can comprise Cu deposited using known techniques such as plating. In one aspect, a titanium adhesion layer and copper seed layer can be sequentially sputtered onto submount 22. Then, approximately 75 μm of Cu can be plated onto the Cu seed layer. The resulting Cu layer being deposited can then be patterned using standard lithographic processes. In other embodiments the Cu layer can be sputtered using a mask to form the desired pattern of elements 16 and 18 such that the mask is used to form a gap 15 by preventing deposition of Cu in that area. In some aspects, mounting pad 14 and elements 16 and 18 can be plated or coated with additional metals or materials to the make mounting pad 14 more suitable for mounting LED chip 12 and/or to improve optical properties, such as amount of light emitted by device 10. For example, the mounting pad 14 and elements 16 and 18 can be plated with adhesive or bonding materials, or reflective and barrier layers. In one aspect, mounting pad 14 and elements 16 and 18 can be plated with a nickel (Ni) barrier layer and a reflective Ag layer of suitable thicknesses.

In general, mounting pad 14 and first and second electrical elements 16 and 18 can be disposed over and/or attached to a top surface 20 of a substrate or submount 22. In one aspect, mounting pad 14 can be integrally formed with and as an extension of first electrical element 16. First electrical element 16 and second electrical element 18 can be physically separated and electrically and/or thermally isolated from each other by gap 15. For illustration purposes, only one LED chip 12 is shown, however, multiple LED chips 12 comprising one or more LED chips having similar or different wavelengths of light are also contemplated. Gap 15 can extend down to the top surface 20 of submount 22 thereby electrically and thermally isolating electrical elements 16 and 18. In one aspect, gap 15 can provide electrical isolation between the first and second electrical elements 16 and 18 to prevent shorting of the electrical signal applied to the LED chip 12.

To improve heat dissipation of light emitter devices, for example devices 10 and 60, mounting pad 14 and electrical elements 16 and 18 can provide extending thermally conductive paths to laterally conduct heat away from the LED chip 12 such that it can spread to other areas of submount 22 beyond the areas just below LED chip 12. For example, mounting pad 14 can cover more surface area of the top surface 20 of submount 22 than that covered by LED chip 12. Mounting pad 14 can extend proximate the edges of submount 22. In the embodiment shown, mounting pad 14 is generally circular can extend radially from LED chip 12 toward the edges of submount 22. It is understood that mounting pad 14 can comprise any suitable shape and/or size and that in some embodiments it can extend flush with the edge of the submount 22.

LED chip 12 as described herein can embody a solid state emitter used alone and/or in combination with phosphors or lumiphors to emit light of various colors, color points, or wavelength ranges, such as the following: (1) primarily blue wavelengths (preferably approximately 430 nm to 480 nm; optionally 430-475 nm, 440-475 nm, 450-475 nm, or any suitable sub-range of 430-480 nm); (2) primarily cyan wavelengths (preferably approximately 481 nm to 499 nm); (3) primarily green wavelengths (preferably approximately 500 nm to 570 nm, optionally 505-515 nm, 515-527 nm, or 527-535 nm, or 535-570 nm, or any suitable sub-range of 500-570 nm a or any suitable sub-range of 500-570 nm); (4) primarily yellow wavelengths (preferably approximately 571 to 590 nm); and (5) primarily red wavelengths (preferably approximately 591 to 750 nm, including an optional orange sub-range (preferably approximately 591 to 620 nm), or 621-750 nm, or 621-700 nm, or 600-700 nm, or 610-700 nm, or 610-680 nm, or 620-680 nm, or 620-670 nm, and/or any suitable sub-range of 591 to 750 nm).

In one aspect, device 10 can comprise one LED chip 12 that is primarily blue, which when illuminated can activate a yellow phosphor disposed over LED chip 12 (e.g., phosphor can be at least partially directly disposed over LED chip 12 and/or on a portion of device 10 that is disposed over LED chip 12, for example, such as a lens 30) such that LED chip 12 comprises a blue shifted yellow (BSY) LED chip 12. In an alternative embodiment, a primarily red LED chip 12 can also be included and disposed below phosphor, encapsulant, and/or lens 30 for mixing to produce warm white output. Light emitter device 10 can also comprise an LED chip 12 configured to activate a red phosphor either disposed over LED chip 12 and/or over a portion of device 10, as for example, red phosphor can be disposed on or in a portion of lens 30 for producing warm white output. In yet a further embodiment, device 10 can comprise more than one LED chip 12 such as a plurality of LED chips. The plurality of LED chips 12 can comprise approximately the same wavelength (e.g., selected from the same targeted wavelength bin) or at least a first LED of the plurality of LED chips 12 can comprise a different wavelength from a second LED of the plurality of LED chips 12 (e.g., at least a first LED could be selected from a different targeted wavelength bin than a second LED).

In general, LED chip 12 can comprise many different semiconductor layers arranged in different ways. LED structures and their fabrication and operation are generally known in the art and are therefore only briefly discussed herein. LED chip 12 can comprise a conductive current spreading structure 24 and/or an electrical contact in the form of one or more wire bond pads 26 disposed on a top surface of LED chip 12. In this embodiment, LED chip 12 can comprise a vertically structured device where a first electrical contact (e.g., an anode) is disposed on the bottom surface (not shown) of LED chip 12 and the second electrical contact (e.g., the cathode) is disposed on the top surface in the form of multiple bond pads 26. That is, in this embodiment, each bond pad 26 can comprise the same electrical polarity that is different than the electrical polarity of the electrical contact on the bottom surface of LED chip 12. Current spreading structure 24 and bond pads 26 can comprise any suitable electrically conductive material, and can be deposited or plated using any suitable method. Materials that can be used, for example, for current spreading structure 24 and bond pad 26 can include gold (Au), copper (Cu), nickel (Ni), indium (In), aluminum (Al), silver (Ag), and/or combinations thereof, and metal alloys, conducting oxides and transparent conducting oxides.

Current spreading structure 24 can comprise a grid having one or more conductive fingers spaced to enhance current spreading from the one or more bond pads 26 into the top surface of LED chip 12. During operation, an electrical signal or current can be applied to the bond pads 26 using, for example, a wire bond 28. Electrical current can pass into LED chip 12 from first electrical element 16 and into second electrical element 18 via wire bond 28 as wire bond 28 extends over gap 15 to electrically connect LED chip 12 to second element 18. The electrical signal or current can spread through the current spreading structure 24 and top surface into LED chip 12. Current spreading structures 24 are often utilized in LEDs where the top surface is p-type, but can also be used for n-type materials. As further described herein, LED chip 12 can comprise a direct attach LED (e.g., see FIG. 5) which may be horizontally structured such that both electrical contacts (e.g., anode and cathode of different electrical polarities) can be disposed on the same bottom surface of the LED. In such an embodiment as shown in FIG. 5, wire bonds 28 are not required to electrically connect the LED chip to electrical elements of the emitter device.

Figure 2:
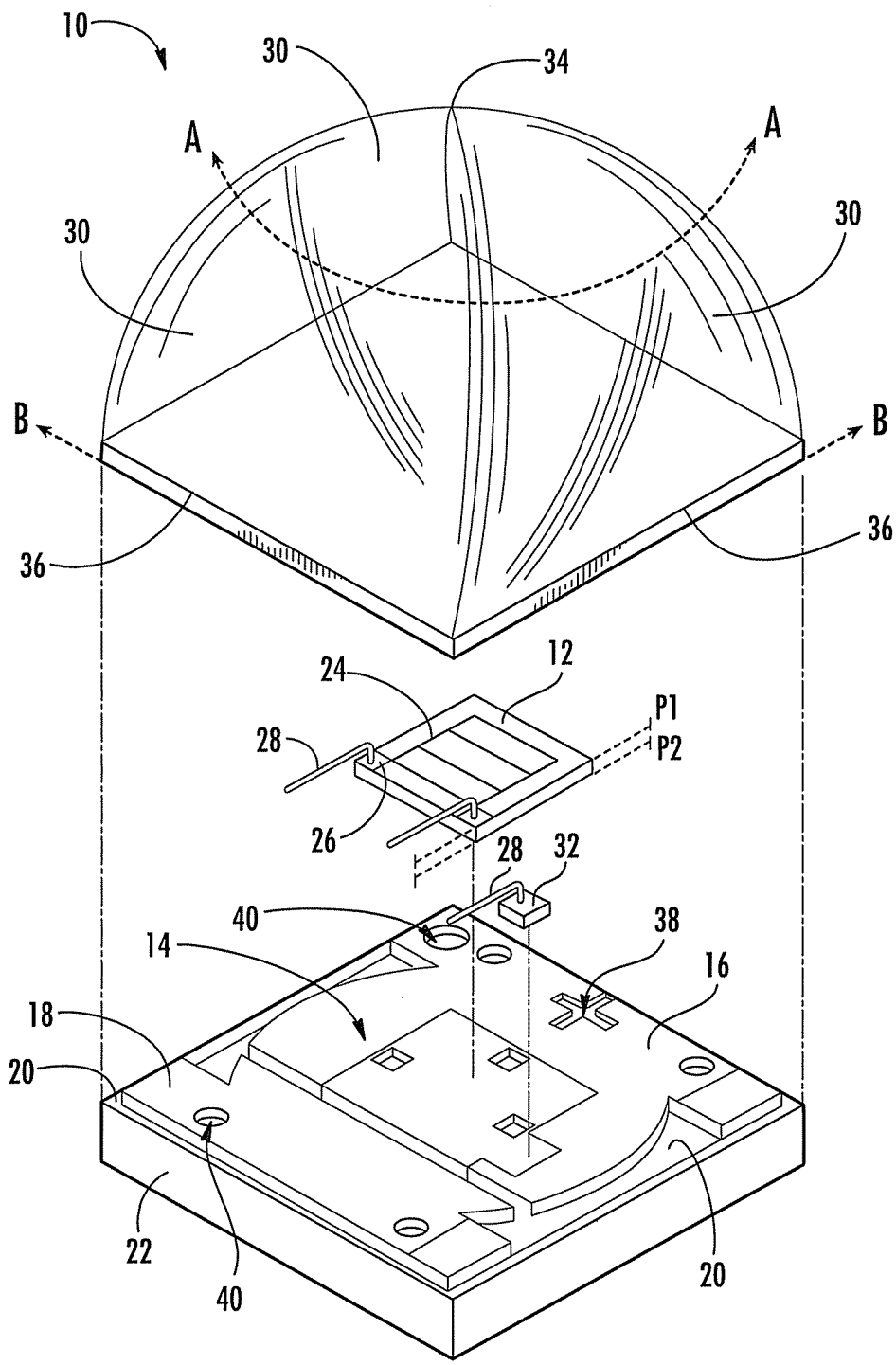
FIG. 2 is an exploded view of a light emitter device according to the disclosure herein.

Referring to FIGS. 1 and 2, and as described above, LED chip 12 can comprise a build where the bottom of the chip comprises an anode electrically communicating with first electrical element 16, and top bond pads 26 comprise a cathode electrically communicating with second electrical element 18 via wire bonds 28. Electrical communication can comprise passing electrical current between electrical elements 16 and 18 and LED chip 12 such that current flows from the first electrical element 16 into LED chip 12 and then from LED chip 12 into second electrical element 18. The embodiment of LED chip 12 is shown for illustration purposes and is not limited to this embodiment. LED chip 12 can comprise any suitable structure, build, size, shape, substrate, and/or type of LED known. LED chip 12 can attach to first element 16 using suitable or known attachment materials and methods, for example, solder attachment, preform attachment, flux or no-flux eutectic attachment, silicone epoxy attachment, metal epoxy attachment, thermal compression attachment, and/or combinations thereof.

LED chip 12 can comprise any suitable chip dimension and/or shape such as substantially square or rectangular in shape. In one aspect, LED chip 12 can comprise a square chip having sides approximately equal to 1000 μm or less (e.g., 1000×1000 μm$^2$). LED chip 12 can comprise a substantially square chip with sides of any range or sub-range less than approximately 1000 μm, for example, an approximately 900×900 μm$^2$ chip; an approximately 700×700 μm$^2$ chip; an approximately 600×600 μm$^2$ chip; an approximately 500×500 μm$^2$ chip; an approximately 400×400 μm$^2$ chip; an approximately 300×300 μm$^2$ chip; an approximately 200×200 μm$^2$ chip; or an approximately 100×100 μm$^2$ chip. As described earlier, multiple LED chips 12 can be utilized in device 10, wherein each LED can be the same size and/or where LED chip 12 can consist of different sizes. LED chip 12 can also comprise rectangular chips of any suitable dimension.

Referring to FIGS. 1 to 6, light emitter devices described herein can further comprise submount 22. Submount 22 can comprise any suitable material, and can be electrically and/or thermally conductive or non-conductive. In one aspect, submount 22 can comprise a ceramic material such as a low temperature co-fired ceramic (LTCC) material, a high temperature co-fired ceramic (HTCC) material, alumina, aluminum nitride (AlN), aluminum oxide (Al$_2$O$_3$), glass, and/or an Al panel material. In other aspects, submount 22 can comprise a plastic material such as polyimide (PI), polyamide (PA), polyphthalamide (PPA), liquid crystal polymer (LCP), or silicone. In other embodiments submount 22 can comprise a printed circuit board (PCB) and variations thereof, sapphire, silicon, or any other suitable material, such as T-Clad thermal clad insulated substrate material, available for example from The Bergquist Company of Chanhassen, Minn. For PCB embodiments and variations thereof, different PCB types can be used such as standard FR-4 PCB, metal core PCB (MCPCB), or any other type of PCB available. In various aspects, it may be desirable to select a submount 22 comprising a material which is a good electrical insulator with low thermal resistance or high thermal conductivity (e.g., AlN). Some materials that may be used as submount 22 have a thermal conductivity of approximately 30 W/m·K or higher, such as zinc oxide (ZnO). Other acceptable materials have thermal conductivities of approximately 120 W/m·K or higher, such as AlN which has a thermal conductivity that can range from 140-180 W/m·K. In terms of thermal resistance, some acceptable submount 22 materials have a thermal resistance of 2° C./W or lower. Other materials may also be used as submount 22 that have thermal characteristics outside the ranges discussed herein.

In one aspect, multiple devices 10 can be formed from a single, large submount panel, wherein individual devices can be singulated from the large panel. Individual devices can be singulated via dicing, sawing, cutting, breaking, or any other suitable method capable of singulating individual device submounts 22 from the larger submount panel. Upon singulation, submount 22 can comprise any size and/or shape, for example, a substantially square, rectangular, circular, oval, regular, irregular, or asymmetrical shape. In one aspect, submount 22 can comprise a square where each side is approximately 3.5 mm or less yielding a surface area of approximately 12.25 millimeters squared (mm$^2$) or less. For example, in one aspect, submount 22 can comprise a square where each side is approximately 2.5 mm or less yielding a surface area of approximately 6.25 mm$^2$ or less. In further aspects, submount 22 can comprise a square where each side is approximately 2.45 mm or less yielding a surface area of approximately 6.00 mm$^2$ or less. Submounts 22 having smaller sides and/or surface areas, for example, sides that are approximately 2.0 mm or less (e.g., 1.5 mm, 1.0 mm, 0.5 mm) are also contemplated herein, and novel features of device package, for example, lens 30, can be scalable to smaller package sizes.

Light emitter devices (e.g., 10, 60 see FIG. 5) disclosed herein can further and optionally comprise elements to protect against damage from electrostatic discharge (ESD). Different elements can be used such as various vertical silicon (Si) Zener diodes, different LED chips arranged in parallel and reverse biased to LED chip 12, surface mount varistors and lateral Si diodes. The arrangement of LED chip 12 and protection device 32 allows excessive voltage and/or current passing through device 10 from an ESD event to pass through protection device 32 instead of LED chip 12 thereby protecting LED chip 12 from damage. In the embodiments shown, a vertically structured ESD protection device 32 can be utilized and mounted over mounting pad 14 using known mounting techniques. ESD protection device 32 can be relatively small in comparison to LED chip 12 such that it does not cover an excessive area on the surface of mounting pad 14 and/or submount 22 and therefore does not block a significant amount of light emitted from LED 12. ESD protection device 32 can also be positioned close to the edge of lens 30 such that it does not block light from the center of device 10. It is understood that in some aspects, light emitter devices described herein can be provided without an ESD protection device 32 or, in an alternative, an ESD protection device 32 can be located external to the light emitter device(s).

FIGS. 1 to 6 further illustrate light emitter devices 10, 60 (FIG. 5), and 70 (FIG. 6) which further comprise an optical element, for example, a lens 30. Lens 30 can be formed over top surface 20 of submount 22, and disposed over the at least one LED chip 12. Lens 30 can provide both environmental and/or mechanical protection of devices 10 and 60. Lens 30 can be disposed at different locations with respect to top surface 20 of submount 22, for example, in one aspect lens 30 can be located as shown having LED chip 12 disposed approximately below a center of lens 30 where it is of a maximum height. The center of lens 30 can be, but does not have to be the same as an apex 34, or point of maximum height of lens 30. In some aspects, the center point of lens 30 is not the apex 34 of lens 30, such that apex 34 of lens 30 can be offset with respect to submount 22. Notably, lens 30 can extend flush with, or nearly flush with one or more corners of submount 22 to maximize the amount of light extracted from corners of device 10 and 60 (FIG. 5).

In conventional devices, as the size of the submount decreases, so must the lens size. Conventional lenses typically do not utilize the area at corners of the device submount. However, larger lens have better light extraction and are more efficient. Notably, novel devices described herein can incorporate novel lens 30 extending to, or nearly to, corners of submount 22. In one aspect, the shape of a lens base 36 can comprise a non-circular shape, for example, a substantially square, rectangular, oval, non-circular regular shape, non-circular irregular shape, an asymmetrical shape, and/or combinations thereof. In other aspects, lens base 36 can comprise the same shape or geometry as submount 22, and a circular lens base 36 corresponding to a circular submount 22 is contemplated. As used herein, the term "lens base" describes the portion from which lens begins its ascent towards apex 34 of lens 30. That is, the term "lens base" describes the portion form which one or more lens edges climb and curve upwardly towards the maximum height of lens 30. Notably, lens base 36 does not comprise a substantially horizontal or flat edge or portion. Conventional lenses can comprise circular bases from which the lens begins its ascent towards the apex, and in some instances can comprise a substantially flat protective layer extending to edges of submount; however, the protective layer cannot be characterized as a lens base as it does not rise and/or curve towards an apex of the lens, and the substantially flat protective layer cannot efficiently extract light from the corner of the device. Notably and in one aspect, lens base 36 of devices 10 and 60 described herein can extend substantially flush with one or more edges of submount 22 such that a portion of one or more corners of submount 22 can be disposed under a curved edge of lens 30. This can more fully utilize the area at corners of submount 22 such that light can be extracted therefrom.

FIG. 2 is an exploded view of device 10. As FIG. 2 illustrates, lens 30 can comprise lens base 36 extending substantially flush with more than one edge of submount 22 such that more than one corner of submount 22 is at least partially covered by lens 30 thereby maximizing light extraction at the more than one corner of submount 22. In one aspect, lens base 36 can comprise substantially the same shape and/or correspond in shape to top surface 20 of submount 22. That is, in one aspect, lens base 36 and submount 22 can comprise substantially the same geometry. As illustrated, lens base 36 and submount 22 can each comprise a substantially square shape. However, any shape of lens base 36 and corresponding submount 22 is contemplated herein. Lens base 36 can extend to corners of submount 22 and ascend towards apex 34. In one aspect, lens 30 can be molded using different molding techniques and can comprise any suitable material. Suitable materials include materials compatible with a molding process and can comprise, for example without limitation, silicones, plastics, epoxies, glasses, or combinations thereof.

In one aspect, silicone is suitable for molding and provides suitable optical transmission properties. It can also withstand subsequent reflow processes and does not significantly degrade over time. As known in the art, a mold (not shown) comprising cavities can be loaded over the large submount panel (e.g., large panel previously described prior to singulation) and arranged over LED chip 12. A lens material and/or encapsulant in liquid form can be dispensed in mold to fill cavities surrounding LED chip 12. In one aspect, lens 30 can comprise liquid curable silicone. LED chip(s) 12 can become embedded in the liquid silicone within a respective one of the cavities. The liquid silicone can then optionally be cured using known curing processes. The mold can then be removed such that a plurality of lenses 30 conforming to the shape of the plurality of cavities is provided, where each lens 30 can be disposed over one or more respective LED chips 12.

Individual light emitter devices 10 (and 60, FIG. 5) comprising a submount 22, LED chip(s) 12, and lens 30 can then be singulated from the large submount panel using any suitable singulation method, for example and as previously described, such as dicing, sawing, breaking etc. The lens arrangement of devices 10 and 60 (FIG. 5) can also easily adapted for use with a secondary lens or optics that can be placed over lens 30 by the end user to facilitate beam shaping. Such secondary lenses are generally known in the art, with many of them being commercially available. Lens 30 can be optically clear, colored, transparent, semi-transparent, opaque, and/or combinations thereof. It is also understood that lens 30 can be textured to improve light extraction or lens 30 can contain a selective amount of optional additional materials such as amounts of one or more phosphors, diffusers, or light-scattering particles.

Still referring to FIG. 2, but also illustrated in additional figures, first electrical element 16 can comprise one or more symbols or indicators, generally designated 38, for indicating electrical polarity of device 10 and for ensuring accurate mounting of devices 10 over an external source such as a PCB, driving circuit, power circuit, or other external substrate or source of electrical current. For example, a first surface mount pad 42 (FIGS. 3A to 4) can electrically communicate with first electrical element 16 and can be mounted over a positive side of an electrical source to drive current through LED chip 12 of device 10. In the example shown, indicator 38 comprises a plus (+) sign over first electrical element 16 indicating that the arrangement should be mounted such that positive electric current flows into first surface mount pad 42 (FIGS. 3A to 4), and then into first electrical element 16, and then finally into LED chip 12. Negative electrical current can flow out of LED chip 12 and into second element 18 and then into a second surface mount pad 44 (FIGS. 3A to 4). Second electrical element 18 can electrically communicate and/or be electrically coupled with second surface mount pad 44 (FIGS. 3A to 4) such that electric current can flow out of device 10 and into to the external substrate such as a PCB, power source, driving circuit, or other circuit or source of electrical current. Various alignment markers, generally designated 40 can be present on device 10 and can comprise one or more markers used during fabrication of the electrical elements to ensure adequate alignment of, for example, a mask during deposition, etching, and/or plating of electrical elements 16 and 18. It is understood that indicator 38 and markers 40 can comprise many different symbols, shapes, and/or indicator types. Symbols or indicators 38 can also be included over second electrical element 18, if desired. It is also understood that the symbols or markers can be placed in other locations other than over electrical elements 16 and 18.

As FIGS. 1, 2, and 3A further illustrate, lens 30 can comprise portions disposed above and/or below a first plane designated by line P1 of LED chip 12. First plane P1 can correspond to a top surface of LED chip 12. However, LED chip 12 can comprise any plane such as for example between first plane P1 and a second plane designated by line P2, which corresponds to the plane of the mounting surface of LED chip 12, or the plane of an upper surface of electrical elements 16. For example, a first portion of lens 30 can comprise a substantially hemispheric shaped cross-section with a substantially square or curved base line along the line A-A. The first portion can be disposed above each of first plane P1 of LED chip 12 and second plane P2 of LED chip 12 mounting surface (e.g., upper surface of electrical element 16). A second portion of lens 30 can comprise a larger diameter with a substantially square shaped base line along the line B-B. The second portion can be disposed below each of first plane P1 and second plane P2 as it can be disposed along the top surface 20 of submount 22. That is, in one aspect, no portion of submount 22 extends above first and second planes P1 and P2 of LED chip 12, but rather, optical lens 30 can extends partially above and below LED chip 12 to fully extract light from corners of device 10.

First and second portions of lens 30 can be connected by and/or disposed along a continuous straight, curved, or angled edge of lens 30. In one aspect, first and second portions of lens 30 can be disposed along an inclined edge of lens 30 that inclines upwardly and/or substantially vertically away from submount 22, where the edge is neither substantially flat nor horizontal in nature. First portion of lens 30 (e.g., along line A-A) can be disposed above planes P1 and P2 associated with upper and mounting surfaces of LED chip 12 and can comprise a first diameter. Second portion of lens 30 (e.g., along line B-B) can be disposed below planes P1 and P2 associated with LED chip 12 and can comprise a second diameter that is larger than first diameter of first portion. In one aspect, second portion can extend flush with one or more outer edges or surfaces of submount 22.

FIGS. 3A and 3B illustrate cross-sectional views of device 10. This view is also representative of device 60 (FIG. 5) where only the location of electrical elements and/or gap 15 would change as appropriate. FIGS. 3A and 3B differ in extension of lens 30 and/or lens base 36. Lens 30 can comprise a lens base 36 having substantially the same shape or geometry as submount 22 and can extend flush with one or more edges of submount as illustrated in FIG. 3A or nearly flush with one or more edges of submount 22 as illustrated in FIG. 3B. Lens 30 can comprise any suitable cross-sectional shape depending on the desired shape of the light output. For example, one suitable cross-sectional shape as shown is hemispheric, with some examples of alternative shapes being ellipsoid, bullet, flat, hex-shaped, and square. Lens 30 can comprise a lens base 36 corresponding in shape to submount 36 and cross-sectional shape can comprise any suitable shape as required by consumers, designers, and/or manufacturers of light emitter devices and products. Lens 30 can comprise apex 34 centrally disposed above a center of submount 22 as shown, or apex 34 can be located off-center with respect to submount 22. Lens 30 can also comprise more than one apex 34 of equal height. Notably, lens 30 extends flush with one or more edges of submount 22 (e.g., FIG. 3A) or nearly flush with one or more edges of submount 22 (e.g., FIG. 3B) for improving light extraction from corners of the device 10. As FIG. 3B illustrates, a slight amount of edge clearance comprising a distance d can exist between one or more edges of submount 22 and lens base 36 such that lens base 36 is nearly flush with submount 22.

A cross-sectional view of one corner area or corner, generally designated C, of device 10 is illustrated in FIG. 3A. For illustration purposes one corner C is illustrated as the area between the edges of submount 22 and the dotted line, however, devices described herein can comprise more than one corner, such as four corners C. Corner C can comprise an area disposed between two adjacent sides or edges of top surface 20 of submount 22. In some aspects, corner C can be disposed between substantially orthogonal sides of submount 22 (see also C bounded by dotted line, FIG. 5). Corner C can comprise any dimension inboard from the sides of submount 22. That is, corner C can comprise an area that is larger or smaller than that illustrated, however, for illustration purposes corner C demonstrates a notable characteristic of lens 30, which is that at least a portion of corner C of submount can be disposed below a curved edge E of lens 30. This can allow more light to be extracted from corner C, thereby improving light extraction and overall brightness of device 10.

As FIGS. 3A and 3B further illustrate, device 10 can further comprise surface mount pads 42 and 44 disposed essentially vertically below portions of first and second electrical elements 16 and 18, respectively. First and second surface mount pads 42 and 44 can be formed on a bottom surface of submount 22 and at least partially in alignment with first and second electrical elements 16 and 18, respectfully. An external source (not shown) can pass an electrical current or signal to device 10 via communication of signal to surface mount pads 42 and 44 when device 10 mounts over the external source. For example, first and second surface mount pads 42 and 44 can electrically communicate to solder contacts or other conductive paths located on the external source (not shown), and can in turn pass current into first and second electrical elements 16 and 18, respectively via conductive paths internally disposed within submount 22. The external source can comprise a PCB, MCPCB, driving circuit, power source, or any other suitable external electrical current source capable of passing electrical current into surface mount pads 42 and 44. In the embodiment shown, device 10 can be arranged for mounting to an external substrate or source using surface mount technology and device 10 can comprise internal electrically conductive paths connecting surface mount pads 42 and 44 to elements 16 and 18, respectively. Internal electrically conductive paths can comprise one or more conductive vias 46.

One or more conductive vias 46 can extend through submount 22 between first surface mount pad 42 and first electrical element 16 such that when electric current or signal is applied to the first surface mount pad 42 it is conducted through submount 22 and into first electrical element 16. Similarly, one or more conductive vias 46 can be formed extending between second surface mount pad 44 second electrical element 18 to conduct an electrical signal between the two. First and second surface mount pads 42 and 44 can allow for surface mounting of device 10 with the electrical signal to be applied to LED 12 (not shown) across the first and second mounting pads 42 and 44. Conductive vias 46 and surface mount pads 42 and 44 can comprise any suitably electrically conductive material and can be provided using any suitable technique, including techniques used for providing mounting pad 14 and first and second electrical elements 16 and 18. It is understood that surface mount pads 42 and 44 and conductive vias 46 can be arranged in many different configurations, and can therefore comprise any suitable shape(s) and/or size(s). As conductive vias 46 connect electrical elements 16 and 18 to respective surface mount pads 42 and 44, it is also understood that electrical elements may be positioned in other arrangements in addition to the arrangement illustrated. Conductive vias 46 can be formed and disposed between respective surface mount pads 42 and 44 and electrical elements 16 and 18 which may not be substantially vertically arranged, but could also be arranged at an angle within submount 22. It is also understood that instead of vias 46, one or more intervening metal layers can be provided between one or more surfaces of the submount between the surface mount pads and electrical elements, or even along external side surfaces of submount 22 between respective surface mount pads and electrical elements.

An optional feature or step which can be included when providing device 10 and as illustrated in FIG. 3A is providing a solder mask 48 comprising conventional materials which can be included over portions of electrical elements 16 and 18 and/or mounting pad 14. Solder mask 48 is designated in broken lines as it is optional and can be placed in any position over electrical elements 16 and 18. In one aspect, portions of solder mask 48 can be disposed in gap 15 and/or directly over portions of top surface 20 of submount 22. This feature is described in U.S. patent application Ser. No. 12/757,891, the entirety of which is incorporated by reference herein. Solder mask 48 can protect conductive features (e.g., electrical elements 16, 18 and mounting pad 14) from the environment and during subsequent processing steps, in particular mounting LED chip 12 to mounting pad 14 and wire bonding LED chip 12. During these steps there can be a danger of solder or other materials depositing in undesired areas, which can result in damage to the areas or result in electrical shorting. Solder mask 48 can provide an insulating and protective material that can reduce or prevent such dangers. In one aspect, solder mask 48 can comprise an opening for mounting LED chip 12 over mounting pad 14 and for attaching wire bonds 28 to second electrical element 18. It can also comprise side openings allowing convenient electrical access to electrical elements 16 and 18 for testing the devices during fabrication.

FIG. 4 illustrates a bottom view of device 10. This view can be that of device 60 as well (FIG. 5). Device 10 can further comprise a thermal element 50 disposed on a bottom surface of submount 22. Thermal element 50 can optionally be disposed between first and second mounting pads 42 and 44, respectively. In one aspect, thermal element 50 is disposed in a central location with respect to submount 22 below the one or more LED chip 12. Thermal element 50 can comprise any thermally conductive material such as a metal, metal-alloy, Sn, Ag, Cu, etc., and can be in at least partial vertical alignment with the LED chip 12. In one embodiment, thermal element 50 is electrically isolated from electrical elements 16 and 18 on top surface 20 of submount 22 as well as first and second surface mount pads 42 and 44 on the bottom surface of submount 22. Although heat from LED chip 12 can laterally spread over top surface 20 of submount 22 via mounting pad 14 and electrical elements 16 and 18, more heat can pass into submount 22 directly below and around LEDs 12. Thermal element 50 can assist with heat dissipation by allowing heat to spread into thermal element 50 where it can dissipate more readily from the device. Heat can also be conducted from top surface 20 of the submount 22 through vias 46 where the heat can spread into first and second surface mount pads 42 and 44 where it can also dissipate. For devices using surface mount technology, the thickness of thermal element 50 and first and second surface mount pads 42 and 44 can be approximately the same such that all three make contact to a lateral surface such as a PCB. To improve wetting of the solder however, and to ensure a more robust contact between thermal element 50 and an external heat sink, thermal element 50 may extend away from the body of the device to a greater distance than surface mount pads. That is, it is contemplated that thermal element 50 can be thicker than surface mount pads 42 and 44.

FIG. 5 illustrates another embodiment of an LED package or light emitter device, generally designated 60. Device 60 can comprise first and second electrical elements 62 and 64, respectively disposed over previously described submount 22. First and second electrical elements 62 and 64 can comprise any suitable electrically conducting material known in the art, for example, metals or metal alloys, Cu, Al, Sn, Ag, conductive polymer material(s), and/or combinations thereof. First and second electrical elements 62 and 64 can be applied using any suitable technique, such as plating, sputtering, or other deposition method. A gap 66 can be disposed between first and second electrical elements 62 and 64 thereby physically separating the elements and electrically and/or thermally isolating the elements. Gap 66 can extend down to top surface 20 of submount 22. Submount 22 can comprise any suitable material as previously described, for example, a LTCC material, a HTCC material, alumina, AlN, $Al_2O_3$, glass, and/or an Al panel material. In other aspects, submount 22 can comprise a plastic material such as PI, PA, PPA, LCP, or silicone or a PCB, MCPCB, or other suitable substrate.

Submount 22 can comprise any suitable size and/or shape, for example, a substantially square, rectangular, circular, oval, regular, irregular, or asymmetrical shape. In one aspect, submount 22 can comprise a square where each side is approximately 3.5 mm or less yielding a surface area of approximately 12.25 millimeters squared ($mm^2$) or less. For example, in one aspect, submount 22 can comprise a square where each side is approximately 2.5 mm or less yielding a surface area of approximately 6.25 $mm^2$ or less. In further aspects, submount 22 can comprise a square where each side is approximately 2.45 mm or less yielding a surface area of approximately 6.00 $mm^2$ or less. Submounts 22 having smaller sides and/or surface areas, for example, sides that are approximately 2.0 mm or less (e.g., 1.5 mm, 1.0 mm, 0.5 mm) are also contemplated herein, and novel features of device package, for example, lens 30, can be scalable to smaller package sizes.

As FIG. 5 illustrates, an LED chip 68 can be partially disposed over portions of each of first and second elements 62 and 64, respectively. LED chip 68 can comprise a direct attach type of LED, where wire bonds (28, FIG. 1) are not required to electrically connect LED chip 68 to elements 62 and 64. That is, LED chip 68 can comprise a horizontally structured device where each electrical contact (e.g., the anode and cathode) can be disposed on the bottom surface of LED chip 68. Die attaching LED chip 68 using any suitable material and/or technique (e.g., solder attachment, preform attachment, flux or no-flux eutectic attachment, silicone epoxy attachment, metal epoxy attachment, thermal compression attachment, and/or combinations thereof) can directly electrically connect LED chip 68 to first and second elements 62 and 64 without requiring wire bonds. LED chip 68 can comprise any size, shape, structure, build, or type of LED. In one aspect, LED chip 68 can comprise angled or beveled sides between an upper and a bottom surface of the LED. That is, the sides of LED chip 68 can slope between upper and bottom surfaces of the LED chip 68, such that the upper surface is smaller than the bottom surface or vice versa. As illustrated, LED chip 68 slopes and/or angles downwardly from a smaller upper surface to a larger bottom surface, however, any configuration of LED chip 68 with angled sides is contemplated.

As known in the art, bevel cut LED chips 68 have more light generated at the beveled surfaces. As such, orienting LED chip 68 such that the beveled surfaces face one or more corners C can further improve light extraction from device 60. In one aspect, the beveled surfaces or sides of LED chip 68 can be offset at an angle θ with respect to sides of submount 22. In one aspect, the surfaces or sides of LED chip 68 can be offset an angle θ of approximately 45° from sides or edges of submount 22 such that beveled surfaces are aligned and facing corners C of device 60. Angle θ can comprise any angle between approximately 0 and 90° between beveled surfaces of LED chip 68 and sides of submount 22, for example, from approximately 0 to 15°; approximately 15 to 30°; approximately 30 to 45°; approximately 45 to 60°; approximately 60 to 75°; or approximately 75 to 90°. Angling LED chip 68 such that the sides are offset approximately 45° with respect to sides of submount 22 however may be preferable for the type of LED shown and described, as this orientation can align beveled sides most directly with corners C, thereby improving light extraction from device 60. In one aspect, the beveled surfaces of LED chip 68 can be orientated an angle θ that is normal to the direction of the largest radius of lens 30 as shown, and similar for rectangular submounts where used.

As FIG. 5 further illustrates, corner C can be disposed between two adjacent sides or edges of submount 22, for example, between substantially orthogonal sides or edges of top surface 20 of submount 22 such that at least a portion of corner C is disposed below a curved edge E of lens 30. As previously described, lens 30 can comprise a lens base 36 of substantially the same and/or corresponding to the geometry of submount 22. As illustrated, lens base 36 and submount 22 can comprise a substantially square shape, however, any shape and/or size is contemplated. In one aspect, lens 30 can extend flush with one or more edges of submount 22 such that at least one corner C is disposed below curved edge E.

Device 60 can further comprise an optional ESD protection device 32 mounted over first electrical element 62 using known mounting techniques and reverse biased with respect to LED chip 68. ESD protection device 32 can be relatively small in comparison to LED 68 such that it does not cover an excessive area on the surface of submount 22 and therefore does not block a significant amount of light emitted from LED chip 68. ESD protection device 32 can also be positioned close to the edge of lens 30 such that it does not block light from the center of device 60. It is understood that in some aspects, light emitter devices described herein can be provided without an ESD protection device 32 or, in an alternative, an ESD protection device 32 can be located external to the light emitter device(s).

Device 60 can further comprise symbols or indicators 38 for denoting the electrical polarity of portions of device 60 thereby ensuring proper electrical connection when surface mounting device to an external power source or circuit (not shown). Device 60 can also comprise various alignment markers 40 for use during fabrication of the electrical elements to ensure adequate alignment of, for example, a mask during deposition, etching, and/or plating of electrical elements 62 and 64. It is understood that indicators 38 and markers 40 can comprise many different symbols, shapes, and/or indicator types. It is further understood that the symbols or markers can be placed in other locations other than over electrical elements 62 and 64. Light emitter device can comprise conductive vias 46 (FIGS. 3A and 3B) electrically connecting first and second electrical elements 62 and 64 to first and second surface mount pads 42 and 44 (FIGS. 3A and 3B).

Figure 6:
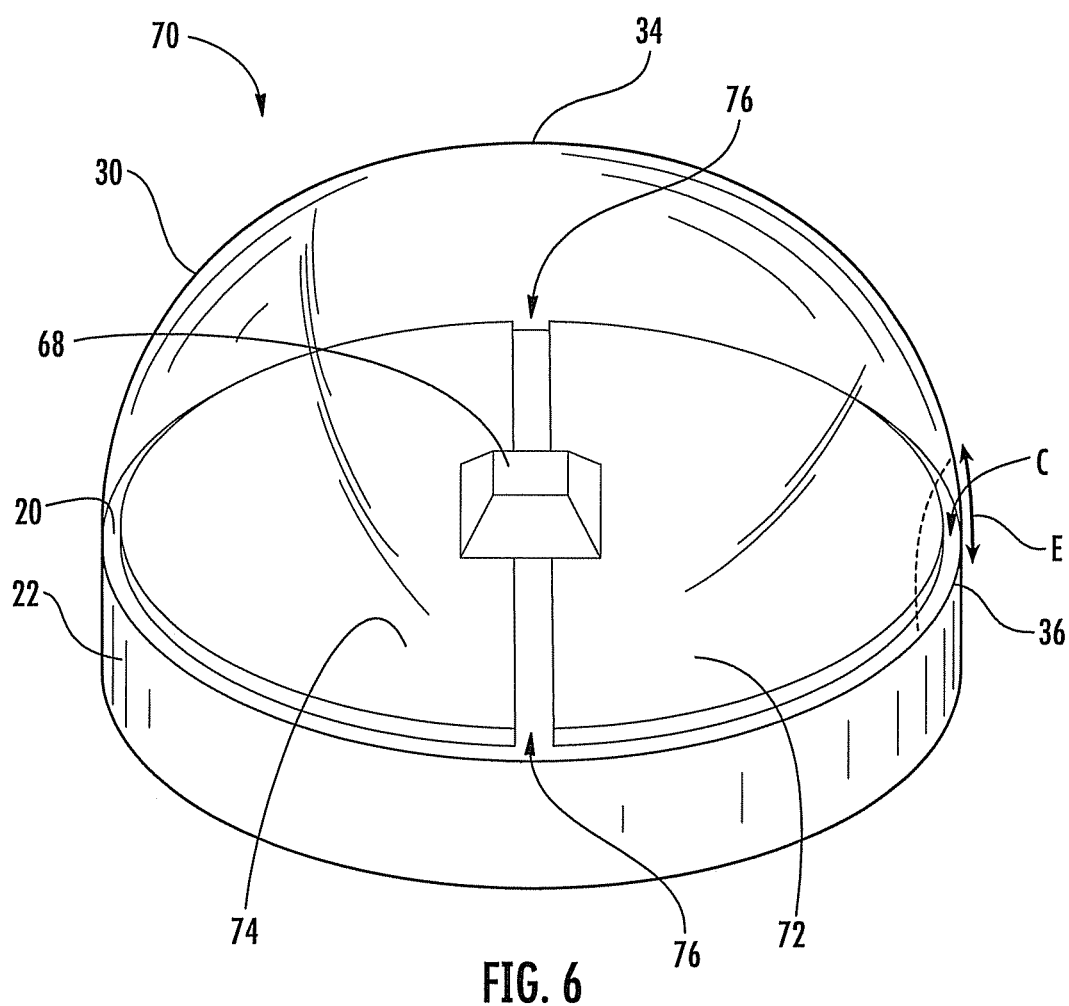
FIG. 6 is a top perspective view of a further embodiment of a light emitter device according to the disclosure herein.

FIG. 6 illustrates another embodiment of an LED package or light emitter device, generally designated 70. Device 70 can comprise first and second electrical elements 72 and 74, respectively disposed over previously described submount 22. Device 70 can be similar in form and function to previously described devices 10 and 60, with the exception of a substantially circular shaped submount 22 and lens 30 with lens base 36. Notably, device 70 can comprise a submount 22 and a lens 30 with lens base 36, each of which can comprise substantially the same geometry, wherein the geometry is circular. First and second electrical elements 72 and 74 can comprise any suitable electrically conducting material known in the art, for example, metals or metal alloys, Cu, Al, Sn, Ag, conductive polymer material(s), and/or combinations thereof. First and second electrical elements 72 and 74 can be applied using any suitable technique, such as plating, sputtering, or other deposition method. A gap 76 can be disposed between first and second electrical elements 72 and 74 thereby physically separating the elements and electrically and/or thermally isolating the elements. Gap 76 can extend down to top surface 20 of submount 22. Submount 22 can comprise any suitable material as previously described, for example, a LTCC material, a HTCC material, alumina, AlN, $Al_2O_3$, glass, and/or an Al panel material. In other aspects, submount 22 can comprise a plastic material such as PI, PA, PPA, LCP, or silicone or a PCB, MCPCB, or other suitable substrate.

As FIG. 6 illustrates, previously described LED chip 68 can be partially disposed over portions of each of first and second elements 72 and 74, respectively such that chip 68 electrically communicates with each of first and second elements 72 and 74. LED chip 68 can comprise a direct attach type of LED, where wire bonds (28, FIG. 1) may not be required to electrically connect LED chip 68 to elements 72 and 74. Device 70 can also comprise an LED chip that is configured to electrically attach to and communicate with electric elements 72 and 74 via wire bonds 28 (FIG. 1). Any type, size, style, or build of LED chip can be used in device 70.

As FIG. 6 further illustrates, a corner C can comprise an area disposed adjacent an outermost edge of submount 22 such that at least a portion of corner C is disposed below a curved edge E of lens 30. In one aspect, lens 30 can extend flush with one or more edges of submount 22 such that at least one corner C can be disposed below curved edge E. Device 70 can further and optionally comprise an optional ESD protection device (e.g., 32, FIG. 5) mounted over first electrical element 72 using known mounting techniques and reverse biased with respect to LED chip 68. Device 70 can further and optionally comprise symbols or indicators (e.g., 38, FIG. 5) for denoting the electrical polarity of portions of device 70 thereby ensuring proper electrical connection when surface mounting device to an external power source or circuit (not shown).

As described herein, devices 10, 60, and 70 can be fabricated using any suitable method. For example, as described above a plurality of lenses 30 can be attached and molded to a large submount panel (not shown). The large submount panel can subsequently be diced (or singulated) in subsequent manufacturing steps to provide a plurality of individual submounts 22. One or more separate processing steps may be required for providing conductive features (e.g., electrical elements 16, 18, 62, 64, 72, 74 and pad 14) on the large panel prior either to dicing and/or subsequent to singulation of individual devices 10, 60, or 70. Such features and processing steps can comprise deposition or plating of mounting pad 14, electrical elements 16, 18, 62, 64, 72, and 74 bottom surface mount pads 42 and 44, conductive vias 46 and thermal element 50, all of which can be arranged to assist in dissipating heat generated by the at least one LED chip. In one aspect, the large submount panel can comprise a plurality of these features arranged in sets, where each of the sets corresponds to one of the plurality of light emitter devices 10, 60, or 70 to be formed from the panel. Many different large submount panel sizes can be used such as for example, 3 inches (in)×4 in, 2 in×4 in, and 4 in by 4 in.

Embodiments of the present disclosure shown in the drawings and described above are exemplary of numerous embodiments that can be made within the scope of the appended claims. It is contemplated that the novel light emitter devices having improved light extraction and methods of making the same can comprise numerous configurations other than those specifically disclosed. It is also contemplated that the novel lenses disclosed herein for providing improved light extraction can be scalable and suitable for any given size and/or shape of light emitter device.

What is claimed is:

1. A light emitter device comprising:
  a submount comprising a first surface, with a first electrical element and a second electrical element disposed on the first surface;
  at least one light emitting chip disposed over the first surface of the submount and electrically connected to each of the first and second electrical elements, wherein the at least one light emitting chip comprises a planar upper surface and an opposing planar lower surface that faces the first surface of the submount; and
  a lens disposed on and encapsulating the at least one light emitting chip, the first electrical element, and the second electrical element, wherein the lens comprises a lens base having substantially the same geometry as a geometry of the submount wherein the lens extends flush with outermost edges of the submount such that at least one corner of the submount and a corner of the first or the second electrical element is disposed below a non-planar and curved surface of the lens; and
  wherein portions of the lens extending to outermost edges of the lens base, outermost edges of the submount, and over outermost edges of the first and second electrical elements are devoid of one or more horizontal surfaces, and wherein the portions of the lens that are devoid of one or more horizontal surfaces extend both above and below a planar lower surface of the light emitting chip.

2. The light emitter device according to claim 1, wherein the geometry of the lens base and the submount is non-circular.

3. The light emitter device according to claim 1, wherein the geometry of the lens base and the submount is circular.

4. The light emitter device according to claim 1, wherein the geometry of the lens base and the submount is square.

5. The light emitter device according to claim 1, wherein the lens comprises a first portion disposed above the planar upper surface of light emitting chip and a second portion disposed below the planar upper surface of light emitting chip.

6. The light emitter device according to claim 5, wherein the first portion and the second portion are disposed along by a continuous straight, curved, or angled edge of the lens.

7. The light emitter device according to claim 1, wherein the at least one light emitting chip is wirebonded to the first or the second electrical element disposed on the submount.

8. The light emitter device according to claim 1, wherein the planar lower surface of the at least one light emitting chip is directly attached to each of the first and second electrical elements disposed on the submount.

9. The light emitter device according to claim 1, wherein the at least one light emitting chip comprises at least one beveled surface.

10. The light emitter device according to claim 9, wherein the at least one beveled surface faces a corner of the submount.

11. The light emitter device according to claim 9, wherein the at least one beveled surface is offset at an angle with respect to a side of the submount.

12. The light emitter device according to claim 11, wherein the angle comprises approximately 45°.

13. The light emitter device according to claim 1, wherein the submount comprises a square geometry where each side is approximately 2.5 mm or less.

14. The light emitter device according to claim 13, wherein the submount comprises a square geometry where each side is approximately 2.0 mm or less.

15. The light emitter device according to claim 13, wherein the submount comprises a square geometry where each side is approximately 1.0 mm or less.

16. The light emitter device according to claim 1, wherein the submount comprises a ceramic material.

17. A light emitter device comprising:
  a submount comprising a first electrical element and a second electrical element disposed on the submount;
  at least one light emitting chip disposed over the submount and electrically connected to the first and second electrical elements, wherein the at least one light emitting chip comprises a planar upper surface and an opposing planar lower surface that faces the submount; and
  a lens disposed on and encapsulating the at least one light emitting chip, wherein the lens comprises a first portion disposed above the planar upper surface of the at least one light emitting chip and a second portion disposed below the planar lower surface of the at least one light emitting chip wherein the lens extends flush with outermost edges of the submount such that at least one corner of the submount and a corner of the first or the second electrical element is disposed below a non-planar and inclined surface of the lens; and
  wherein the first portion and the second portion are disposed along a continuous non-planar edge of the lens.

18. The light emitter device according to claim 17, wherein the lens comprises a lens base having substantially the same geometry as a geometry of the submount.

19. The light emitter device according to claim 18, wherein the geometry of the lens base and the submount is non-circular.

20. The light emitter device according to claim 18, wherein the geometry of the lens base and the submount is circular.

21. The light emitter device according to claim 18, wherein the geometry of the lens base and the submount is square.

22. The light emitter device according to claim 17, wherein the at least one light emitting chip is wirebonded to the first or the second electrical element disposed on the submount.

23. The light emitter device according to claim 17, wherein the planar lower surface of the at least one light emitting chip is directly attached to each of the first and second electrical elements disposed on the submount.

24. The light emitter device according to claim 17, wherein the at least one light emitting chip comprises at least one beveled surface.

25. The light emitter device according to claim 24, wherein the at least one beveled surface faces a corner of the submount.

26. The light emitter device according to claim 24, wherein the at least one beveled surface is offset at an angle with respect to a side of the submount.

27. The light emitter device according to claim 26, wherein the angle comprises approximately 45°.

28. The light emitter device according to claim 17, wherein the submount comprises a square geometry where each side is approximately 2.5 mm or less.

29. The light emitter device according to claim 28, wherein the submount comprises the square geometry where each side is approximately 2.0 mm or less.

30. The light emitter device according to claim 28, wherein the submount comprises the square geometry where each side is approximately 1.0 mm or less.

31. The light emitter device according to claim 17, wherein the submount comprises a ceramic material.

32. A light emitter device comprising:
a submount comprising a first electrical element and a second electrical element disposed on the submount;
at least one light emitting chip disposed over the submount and electrically connected to each of the first and second electrical elements, wherein the at least one light emitting chip comprises a planar upper surface and an opposing planar lower surface that faces the submount; and
a lens disposed on the at least one light emitting chip, wherein the lens extends flush with outermost edges of the submount such that at least one corner of the submount and a corner of the first or the second electrical element is disposed below a non-planar and inclined surface of the lens, and wherein the non-planar and inclined surface of the lens extends both above and below the planar lower surface of the light emitting chip.

33. The light emitter according to claim 32, wherein the lens comprises a first portion disposed above the planar upper surface of the at least one light emitting chip and a second portion disposed below the planar upper surface of at least one light emitting chip.

34. The light emitter according to claim 33, wherein the first portion and the second portion are disposed along a continuous straight, curved, or angled edge of the lens.

35. The light emitter device according to claim 32, wherein the lens comprises a lens base having substantially the same geometry as a geometry of the submount.

36. The light emitter device according to claim 35, wherein the geometry of the lens base and the submount is non-circular.

37. The light emitter device according to claim 35, wherein the geometry of the lens base and the submount is circular.

38. The light emitter device according to claim 35, wherein the geometry of the lens base and the submount is square.

39. The light emitter device according to claim 32, wherein the at least one light emitting chip is wirebonded to the first or the second electrical element disposed on the submount.

40. The light emitter device according to claim 32, wherein the planar lower surface of the at least one light emitting chip is directly attached to each of the first and second electrical elements disposed on the submount.

41. The light emitter device according to claim 32, wherein the at least one light emitting chip comprises at least one beveled surface.

42. The light emitter device according to claim 41, wherein the at least one beveled surface faces a corner of the submount.

43. The light emitter device according to claim 41, wherein the at least one beveled surface is offset at an angle with respect to a side of the submount.

44. The light emitter device according to claim 43, wherein the angle comprises approximately 45°.

45. The light emitter device according to claim 32, wherein the submount comprises a square geometry where each side is approximately 2.5 mm or less.

46. The light emitter device according to claim 45, wherein the submount comprises a square geometry where each side is approximately 2.0 mm or less.

47. The light emitter device according to claim 45, wherein the submount comprises the square geometry where each side is approximately 1.0 mm or less.

48. The light emitter device according to claim 32, wherein the submount comprises a ceramic material.

49. A method of providing a light emitter device, the method comprising:
providing a submount comprising a first electrical element and a second electrical element disposed on the submount;
electrically connecting at least one light emitting chip to the first and second electrical elements disposed on the submount, wherein the at least one light emitting chip comprises a planar upper surface and an opposing planar lower surface that faces the submount; and
forming a lens on and encapsulating the at least one light emitting chip such that a lens base comprises substantially the same geometry as a geometry of the submount, wherein the lens extends flush with outermost edges of the submount such that at least one corner of the submount and a corner of the first or the second electrical element is disposed below a non-planar and inclined surface of the lens; wherein portions of the lens extending to outermost edges of the lens base, outermost edges of the substrate, and over outermost edges of the first and second electrical elements are non-planar, and wherein the non-planar portions of the lens extend both above and below the planar lower surface of the light emitting chip.

50. The method according to claim 49, wherein forming the lens comprises molding the lens such that the geometry of the lens base is non-circular.

51. The method according to claim 49, wherein forming the lens comprises molding the lens such that the geometry of the lens base is circular.

52. The method according to claim 49, wherein forming the lens comprises molding the lens such that the geometry of the lens base is square.

53. The method according to claim 49, wherein forming the lens comprises forming a first portion and forming a second portion, where the first portion is formed above the planar upper surface of the light emitting chip and a second portion is formed below the planar upper surface of the light emitting chip.

54. The method according to 53, wherein the first portion and the second portion are disposed along a continuous straight, curved, or angled edge of the lens.

55. The method according to claim 49, wherein electrically connecting the at least one light emitting chip comprises wirebonding the light emitting chip to the first or the second electrical element disposed on the submount.

56. The method according to claim 49, wherein electrically connecting the at least one light emitting chip comprises attaching a portion of the bottom surface of the light emitting chip to each of the first or the second electrical elements disposed on the submount.

57. The method according to claim 49, wherein electrically connecting the at least one light emitting chip comprises electrically connecting a light emitting chip comprising at least one beveled surface.

58. The method according to claim 57, further comprising angling the at least one beveled surface to face a corner of the submount.

59. The method according to claim 57, further comprising angling the at least one beveled surface approximately 45° with respect to a side of the submount.

60. The method according to claim 49, wherein providing the submount comprises providing a square geometry where each side is approximately 2.5 mm or less.

61. The method according to claim 60, wherein providing the submount comprises providing a square geometry where each side is approximately 2.0 mm or less.

62. The method according to claim 60, wherein providing the submount comprises providing a square geometry where each side is approximately 1.0 mm or less.

63. The method according to claim 49, wherein providing the submount comprises providing a ceramic submount.

64. A light emitter device comprising:
 a submount comprising a first electrical element and a second electrical element disposed on the submount;
 at least one light emitting chip disposed over the submount and electrically connected to the each of the first and second electrical elements, wherein the at least one light emitting chip comprises a planar upper surface and an opposing planar lower surface that faces the submount; and
 a lens disposed on and encapsulating the at least one light emitting chip, wherein a lens base and the submount have a non-circular configuration, and wherein portions of the lens extending to outermost edges of the lens base, outermost edges of the submount, and over outermost edges of the first and second electrical elements are devoid of one or more horizontal surfaces, wherein the lens extends flush with outermost edges of the submount such that at least one corner of the submount and a corner of the first or the second electrical element is disposed below a non-planar and inclined surface of the lens; and
 wherein the portions of the lens that are devoid of one or more horizontal surfaces extend both above and below the planar lower surface of the light emitting chip.

65. The light emitter device according to claim 64, wherein the shape of the lens base and the submount is square.

66. The light emitter device according to claim 64, wherein the at least one light emitting chip comprises at least one beveled surface.

67. The light emitter device according to claim 66, wherein the at least one beveled surface faces a corner of the submount.

68. The light emitter device according to claim 64, wherein the submount comprises a square shape where each side is approximately 2.5 mm or less.

\* \* \* \* \*